United States Patent
Yoo et al.

(10) Patent No.: US 7,057,432 B2
(45) Date of Patent: Jun. 6, 2006

(54) LOW POWER HIGH FREQUENCY PHASE DETECTOR

(75) Inventors: Seung-Moon Yoo, Santa Clara, CA (US); Hung C. Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 10/960,608

(22) Filed: Oct. 7, 2004

(65) Prior Publication Data

US 2006/0076991 A1    Apr. 13, 2006

(51) Int. Cl.
*H03L 7/06*    (2006.01)

(52) U.S. Cl. .......................................... 327/158; 327/12

(58) Field of Classification Search ................ 327/158, 327/12
See application file for complete search history.

(56) References Cited

U.S. PATENT DOCUMENTS

| | | | |
|---|---|---|---|
| 6,683,478 B1 * | 1/2004 | Yoo | 327/12 |
| 6,690,209 B1 * | 2/2004 | Cyrusian | 327/12 |

\* cited by examiner

*Primary Examiner*—Kenneth B. Wells
*Assistant Examiner*—Khareem E. Almo
(74) *Attorney, Agent, or Firm*—Richard F. Frankeny; WInstead Sechrest & Minick P.C.; Casimer K. Salys

(57) ABSTRACT

A phase detector employs a modified logic gate in conjunction with a set/reset latch to make a phase detector that generates control outputs for use in increasing and decreasing the delay in a delay circuit in the path of a feedback clock generated by delaying a reference clock. The delay circuit provides a controllable delay from less than to greater than one clock cycle of the reference clock. The phase detector generates an up control (UP) signal for increasing delay when the feedback clock leads the reference clock and a down control (DN) signal for decreasing delay when the feedback clock lags the reference clock. The UP signal and DN signal are updated each clock cycle when the leading clock edge makes a transition.

33 Claims, 9 Drawing Sheets

LOW POWER HIGH FREQUENCY PHASE DETECTOR

TECHNICAL FIELD

The present invention relates in general to phase detectors and, in particular, to phase detectors used in delay locked loops (DLL).

BACKGROUND INFORMATION

A phase locked loop (PLL) or a DLL both require a phase detector as a fundamental functional block. The PLL utilizes the phase detector with a voltage controlled oscillator (VCO) to generate high frequencies that are a multiple of a reference clock that is generated to have a stable frequency. The output of the VCO is frequency divided to generate a divided clock. The divided clock is phase compared with the reference clock thereby generating an error signal. The error signal is used to control the VCO. Increasing the VCO frequency makes transitions occur earlier and decreasing the VCO frequency makes transitions occur later relative to the reference frequency. Using a phase comparator and the VCO in this manner allows the divided frequency to phase lock with the reference frequency when in a closed loop feedback system. Depending on the type of phase detector, a PLL may generate a divided frequency that is phase and frequency locked to the reference and a VCO clock that is a multiple of the reference frequency.

In a DLL, two signals that have the same frequency but are phase shifted may be phase aligned by adding delay to one of the signals. If the delay line used to add delay is voltage controlled, then a phase detector that measures the phase shift may be used to produce an error signal that adds delay to one signal until the error signal is minimized. For example, in clock distribution between systems or chips it may be desirable to have the clock used throughout the systems to be synchronous, each clock edge occur at the same time. A DLL may be used to align the clock signals in two separated systems so that the clocks in both systems are synchronous even though they may be separated by a significant delay time relative to their clock period. The higher the clock frequency the more this is a problem. If clocks cannot be aligned, then the clock frequency in a synchronous system may be high frequency limited.

Most phase detectors produce an error signal proportional to the actual phase angle shift between the two signals. In logic systems, the signals are binary and the phase error can only be determined each clock cycle. If the phase error is leading, then the voltage controlling the delay line needs to slew in one direction (e.g., increase) and if the phase error is lagging, then the voltage needs to slew in the other direction (e.g., decrease). A charge pump is a circuit where a capacitor is charged and discharged with current sources to produce an increasing or decreasing voltage with a DC value proportional to the time difference between charge and discharge cycles. Typically, pulse generators are used to produce a pulse on the clock signal edges wherein the pulses are used to set and reset a latch whose normal and inverting outputs are used to control the charge and discharge of the capacitor in the charge pump. However, if the clocks are high frequency, then the pulses that must be generated each clock cycle must be correspondingly very short. The circuitry to generate the pulses adds power and the short pulses may introduce jitter to the delayed clock.

There is, therefore, a need for a phase detector directed to the requirements of a DLL used to align very high frequency clocks without producing pulses on each clock edge thus reducing power and decreasing clock edge jitter.

SUMMARY OF THE INVENTION

A reference clock is used to generate a feedback clock that is delayed through a voltage controlled delay line. The feedback clock is delayed sufficiently to produce feedback clock edges that are aligned with the reference clock edges one clock cycle later. Since the reference clock is already high frequency, the circuitry of the present invention produces a controlling action for the full cycle during which the feedback clock either leads or lags the reference clock. For example, if the reference clock is a 2 GHz clock, the full clock cycle is only one-half nanosecond. Therefore, corrective action following a detection of a phase shift would occur for a maximum of one-half nanosecond each clock cycle. The voltage controlled delay line has an insertion delay and the feedback clock naturally lags the reference clock from which it is generated. Delay must be added to the delay line until the feedback clock is delayed one clock cycle wherein it phase aligns with the reference clock. The delay line is configured such that the feedback clock has an initial delay of greater than one half clock cycle but less than one clock cycle. In this manner, when the feedback clock leads the reference clock delay is increased and when the feedback clock lags the reference clock delay is decreased.

The phase detector according to embodiments of the present invention uses a set/reset (RS) latch with an output and an inverting output that control a charge pump. The output is defined as the down (DN) control that is used to decrease delay when the feedback clock lags the reference clock. The inverting output is defined as the up (UP) control that is used to increase delay when the feedback clock leads the reference clock.

As stated, a positive transition of the feedback clock lags the positive transition of reference clock, from which it is generated, until the feedback clock is delayed more than one half a clock (fixed plus variable). After more than one half clock cycle of delay is added, the feedback clock is seen as leading the reference clock until it is delayed greater than one clock cycle wherein the reference clock again will lead the feedback clock.

The RS latch has set and reset inputs that enable the RS latch to be set if it is in the reset state and to be reset if it is in the set state. In one embodiment, the set and reset inputs are each controlled by a three input (A, B, and C) inverting "modified" logic gate (MLG) with an output Z that has one logic function that generates a logic one state and another logic function that generates the logic zero state. The output Z is a logic one if (A and B) or C are logic zero. Output Z is a logic zero only if (B and C) are logic one. Input A is only used to control a pull-up device and is not used to control a pull-down device. The set input is coupled to the output of a first MLG where the feedback clock is coupled to its "A" input and the reference clock is coupled to the "B" input. The reset input is coupled to the output of a second MLG where the feedback clock is coupled to the "B" input and the reference clock is coupled to the "A" input. The output of the first MLG is coupled to the "C" input of the second MLG and the output of the second MLG is coupled to the "C" input of the first MLG.

The action of the first and second MLG along with the RS latch generates either a logic one on the UP control or a logic one on the DN control depending on whether the feedback clock is leading or lagging the reference clock during each clock cycle. No pulses are required in embodiments of the present invention; the control signals are determined only by which clock first transitions to a logic one during each clock cycle.

When both clocks are a logic zero, both outputs of the first MLG and the second MLG are a logic one. If the reference clock is leading the feedback clock, then it will be the first to transition to a logic one. Because the clock signals are coupled to specific inputs in the MLG, the clock signal that is leading will transition to a logic one first causing its output to transition to a logic zero, degating the other MLG. The latch input coupled to the controlling MLG will activate when the output of the MLG transitions to a logic zero. The output of the controlling MLG will remain a logic zero until both clocks transition to a logic zero. On the next clock cycle, the leading clock phase will cause its MLG to transition to a logic zero again activating the latch and causing the outputs to either increase or decrease the control voltage to the voltage controlled delay line.

The first and second MLGs have input states wherein the output is in a floating condition. When the "A" input is a logic one, the "B" input is a logic zero, and the "C" input is a logic one, the output of the first and second MLGs float for a short duration.

In another embodiment of the present invention, another pull-down device controlled by the "A" input is added in parallel to the pull-down device controlled by the "B" input forming an MLG1 configuration. This eliminates the floating condition but creates a race condition when the output of cross-coupled first and second MLG1s are coupled to the "C" inputs. By making the pull-down device coupled to the "B" input larger than the added pull-down device controlled by "A" input, prevents the race condition.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
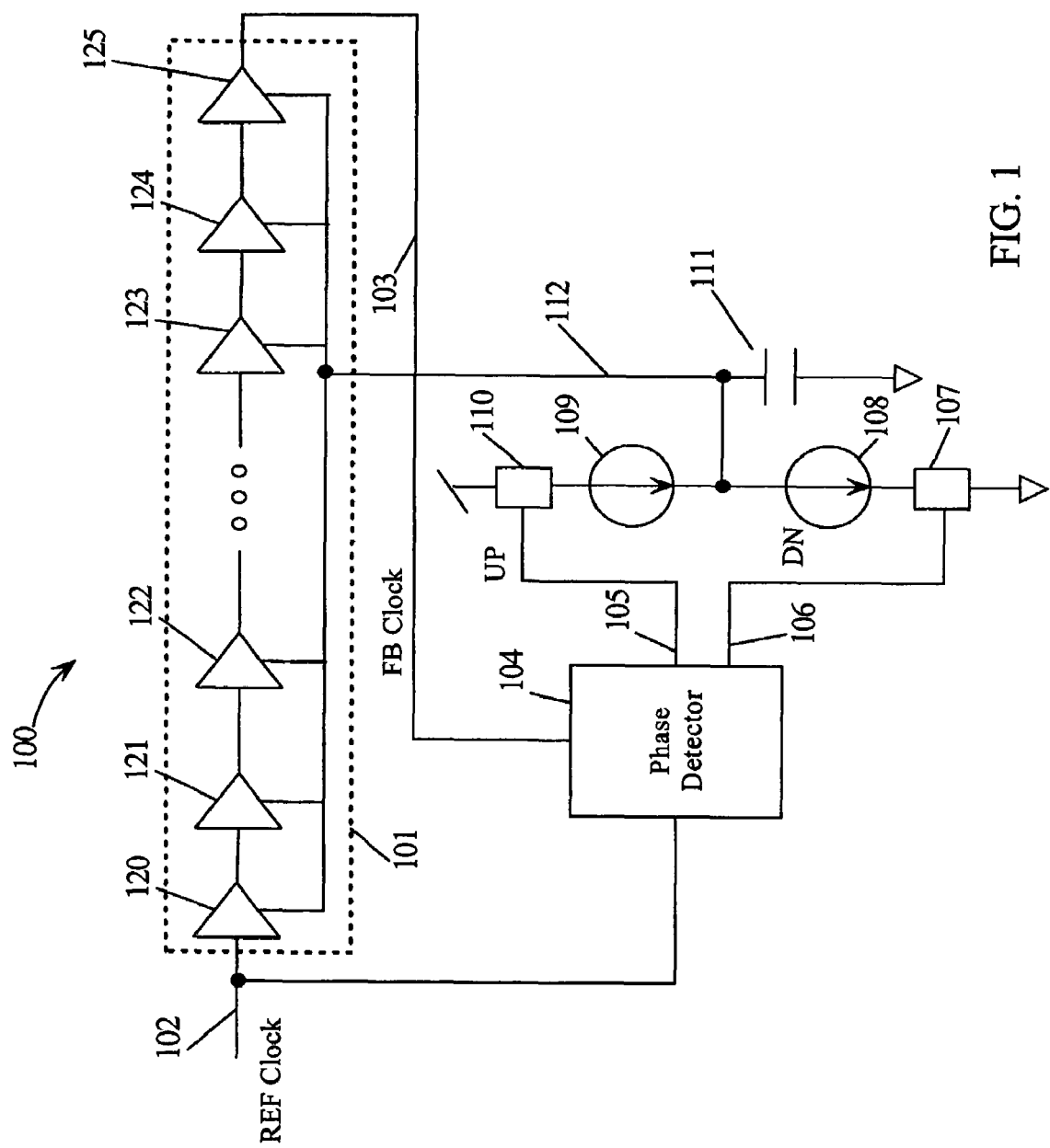
FIG. 1 is a block diagram of a delay locked loop (DLL) with a charge pump voltage generator.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1 is a block diagram of DLL circuitry used to generate a feedback (FB) clock 103 that is in phase with a reference (REF) clock thereby generating multiple clock phases over a clock cycle (output of each stage 120–125). A voltage controlled delay circuit 101 comprises multiple delay stages 120–125 that have sufficient delay to delay REF clock 102 over a range greater than one half clock period to greater than one clock period. This assures that FB clock 103 may be brought in phase with REF clock 102. Phase detector 104 generates two control signals, UP 105 and DN 106. UP 105 and DN 106 are used to gate current source 109 and current sink 108 with electronic switches 110 and 107, respectively. If switch 110 is ON (switch 107 OFF), current source 109 charges capacitor 111 increasing control voltage 112. If switch 107 is ON (switch 110 OFF), current sink 108 discharges capacitor 111 decreasing control voltage 112. Voltage controlled delay circuit 101 comprises multiple like delay stages 120–125. When DLL 100 phase locks REF clock 102 and FB clock 103, the control voltage 112, on average, is constant and the delay through delay circuitry 101 is substantially equal to one clock cycle of REF clock 102.

Figure 2:
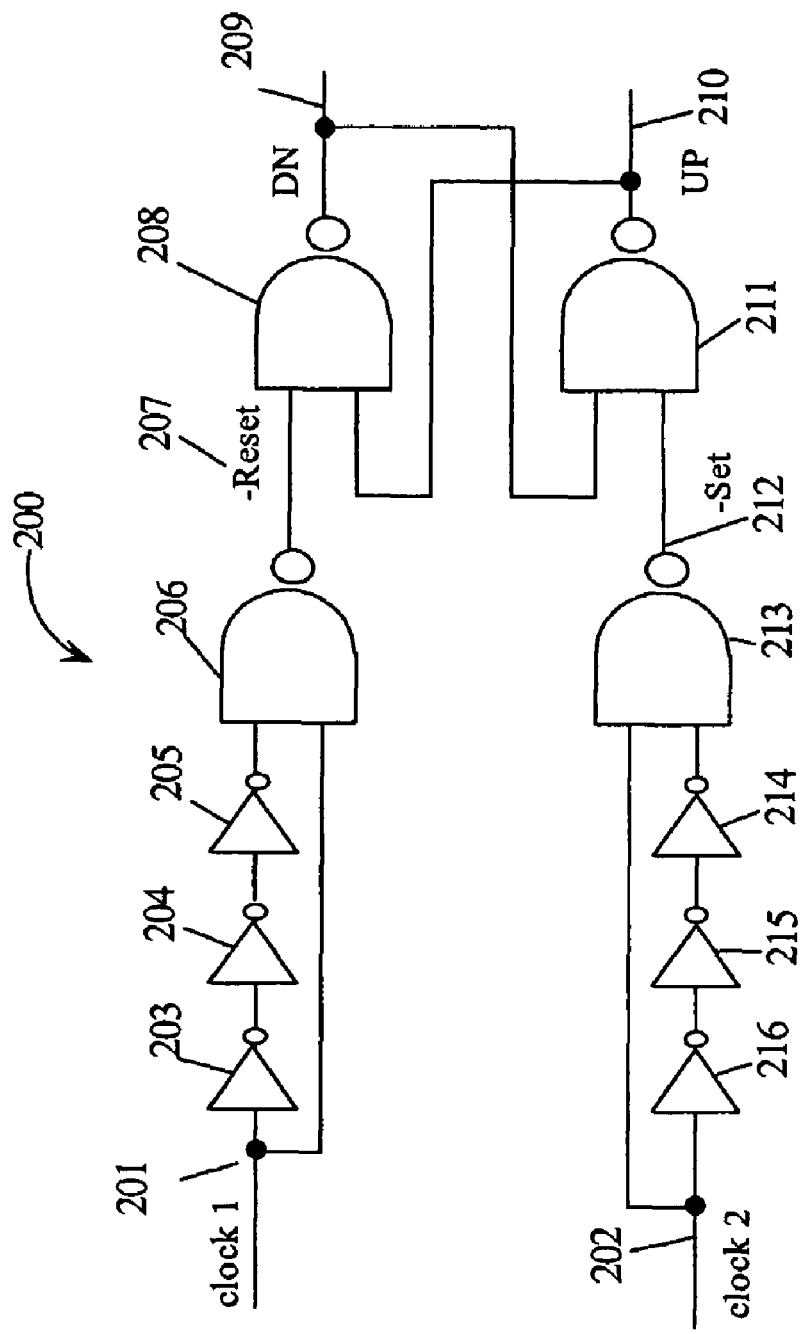
FIG. 2 is a circuit diagram of a pulse generator for generating pulses for a prior art phase detector.

FIG. 2. is a prior art phase detector that utilizes pulses to set and reset an RS latch made up of NAND gates 208 and 211. NAND gate 208 generates a latch control signal DN 209 as a logic one when Reset 207 transitions to a logic zero. Likewise, NAND gate 211 generates a latch control signal UP 210 as a logic one when Set 212 transitions to a logic zero. The circuitry comprising NAND gate 206 and inverters 203–205 generate Reset 207 as a logic zero pulse on each positive transition of clock 201. The circuitry comprising NAND gate 213 and inverters 214–216 generate Set 212 as a logic zero pulse on each positive transition of clock 202. This makes it unlikely that Set 212 and Reset 207 are concurrently at a logic zero state except when they are perfectly aligned. In this circuit configuration, when clock 201 leads clock 202, the pulse at Reset 207 is generated when clock 201 transitions to a logic one will occur first and DN 209 will transition to a logic one. When clock 202 transitions to a logic one, a pulse is generated at Set 212 and UP 210 will transition to a logic one thus causing DN 209 to transition to a logic zero. While this circuit works fine for clocks with periods much longer than the pulse width generated by NAND gates 206 and 213, it does not perform well when the clock frequencies are high (e.g., 1 GHZ or greater). At 1 GHz, the period of the clock is only 1 nanosecond and the pulses would have to be very short to assure the pulse width did not appreciably affect the duration of the control signals DN 209 and UP 210. This would result in jitter in the delay clock generated using phase detector 200 if the phase angle was such that both Reset 207 and Set 212 were a logic zero at the same time.

FIG. 3A is a circuit diagram of a modified logic gate (MLG) 300 used in a phase detector (not shown) according to embodiments of the present invention. The logic function of MLG 300 cannot be written such that the input combination (A 301, B 302, and C 303) that produces a logic one state at the output Z 311 is the logic negation of the input combination that produces a logic zero state at output Z 311. Therefore a state table 320 is used to show the output states of Z 311 in response to the possible logic states of inputs A 301, B 302, and C 303. A logic one is generated at output Z 311 whenever (A 301 and B 302) are logic zero or (C 303) is a logic zero. These logic combinations correspond to states 1–5. A logic zero is generated at output Z 311 whenever (B 302 and C 303) are a logic one. A 301 may be either logic state as it is not coupled to a pull-down device in this embodiment. These logic combinations correspond to states 7 and 8. When (A 301 and C 303) are a logic one and (B 302) is a logic zero (state 6), output Z 311 "floats" as both the pull-up (PFETs 304, 305 and 308) paths and the pull-down (NFETs 306–307) path are open. The floating state (state 6) is only a concern if the phase detector employing MLG 300 has the particular input states (state 6) in normal operation.

FIG. 3B is a table of the logic states of output Z 311 versus the possible logic states of inputs A 301, B 302 and C 303.

FIG. 3C is a circuit symbol 330 for MLG 300 with inputs A 301, B 302 and C 303 and output Z 311. The circle 312 indicates that MLG 300 is an inverting block. Circuit symbol 330 may be used in the following FIGS. 4–5 to simplify the circuit diagrams.

FIG. 4A is a circuit diagram of a modified logic gate (MLG1) 400 used in the phase detector (not shown) according to embodiments of the present invention. The logic function of MLG1 400 is shown in state table 420 to show the output states of Z 411 in response to the possible logic states of inputs A 401, B 402, and C 403. A logic one is generated at output Z 411 whenever (A 401 and B 402) are a logic zero or (C 403) is a logic zero. This condition corresponds to logic states 1–5. A logic zero is generated at output Z 411 whenever (B 402 and C 403) or (A 401 and C 403) are a logic one. When (A 401 and C 403) are a logic one and (B 402) is a logic zero (logic state 6), output Z 411 is a logic zero. The floating state 6 in FIG. 3B is fixed with the addition of NFET 413. However, when used to form a phase detector, according to embodiments of the present invention, state 6 of MLG1 400 may cause a race condition when two MLG1 400 circuits are cross coupled. To solve this problem, MLG1 400 uses a large device for NFET 406 and a small device for NFET 413. This assures that the path comprising NFET 406 and 407 takes precedence over the path comprising NFET 413 and 407.

FIG. 4B is a table of the logic states of output Z 411 versus the possible logic states of inputs A 401, B 402 and C 403.

Figure 4:
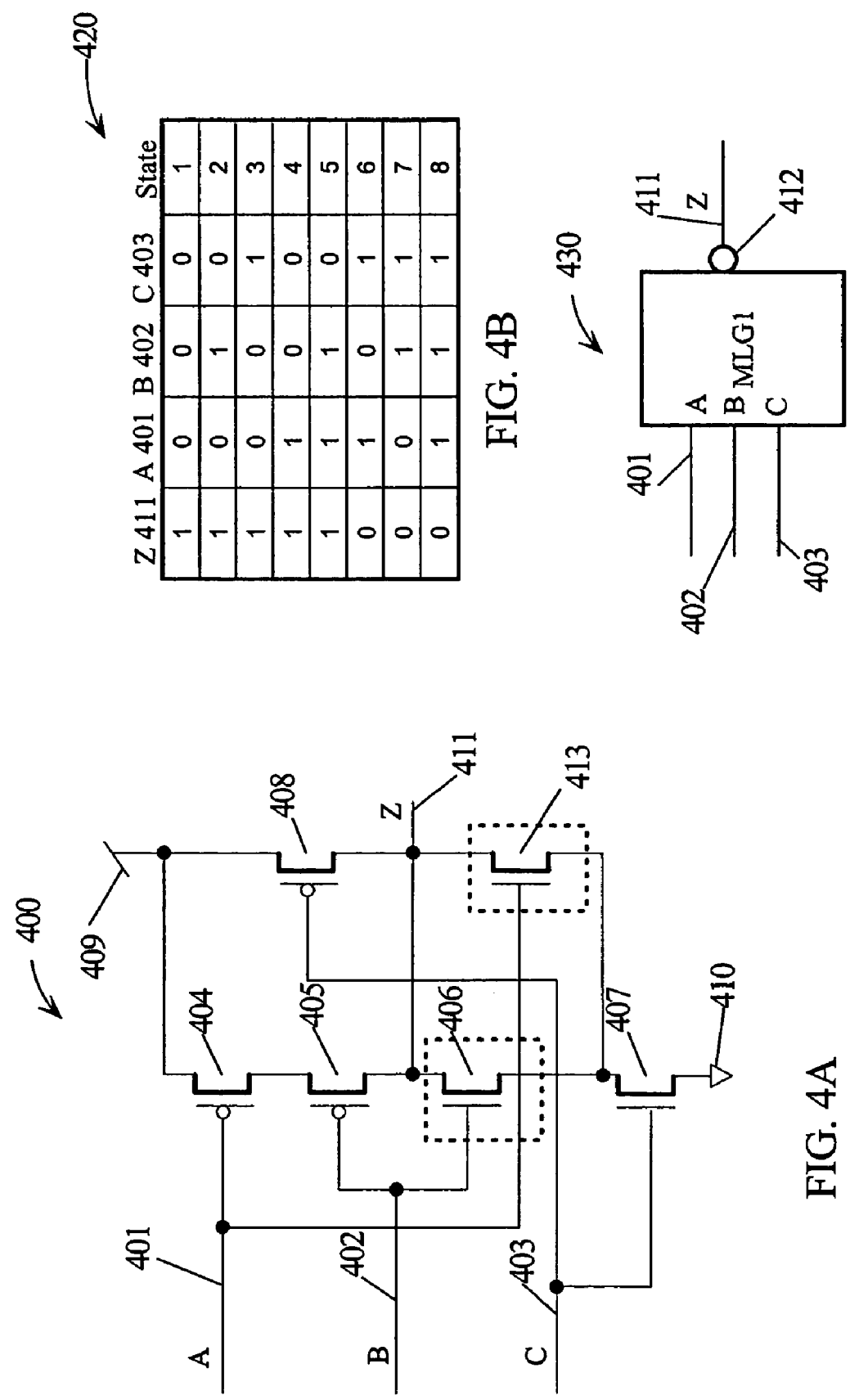
FIG. 4A is a circuit diagram of another modified logic gate that eliminates the floating state while maintaining the functionality for a phase detector according to embodiments of the present invention.
FIG. 4B is a state table for the circuit of FIG. 4A.
FIG. 4C is a circuit symbol for the circuit of FIG. 4A.

FIG. 4C is a circuit symbol 430 for MLG1 400 with inputs A 401, B 402 and C 403 and output Z 411. The circle 412 indicates that MLG1 400 is an inverting block. Circuit symbol 430 may be used in following FIGS. 4–7 to simplify the circuit diagrams.

Figure 3:
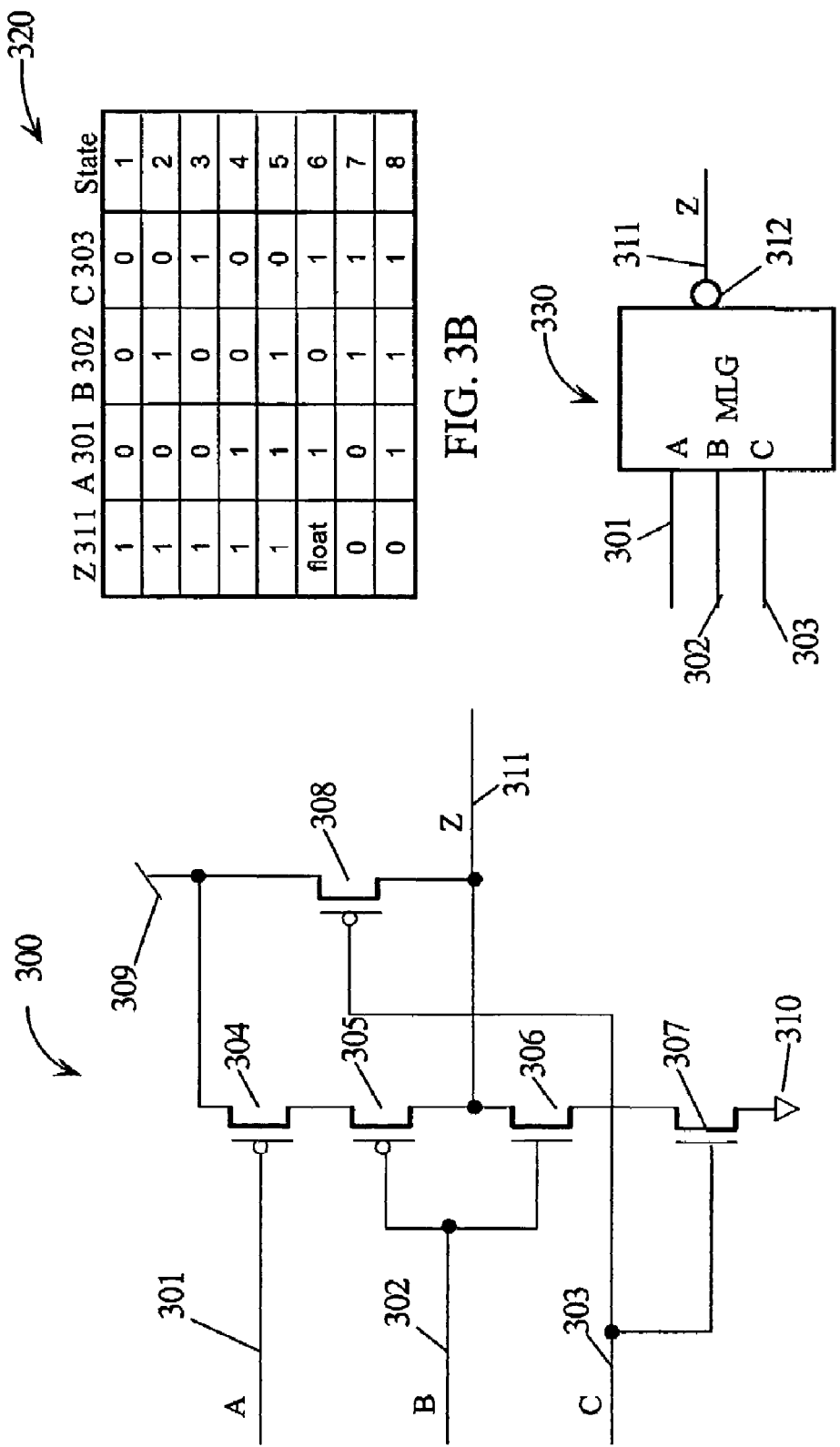
FIG. 3A is a circuit diagram of a modified logic gate (MLG) used to generate set and reset inputs for the RS latch of a phase detector configured according to embodiments of the present invention.
FIG. 3B is a state table for the circuit of FIG. 3A.
FIG. 3C is a circuit symbol for the circuit of FIG. 3A.
Figure 5:
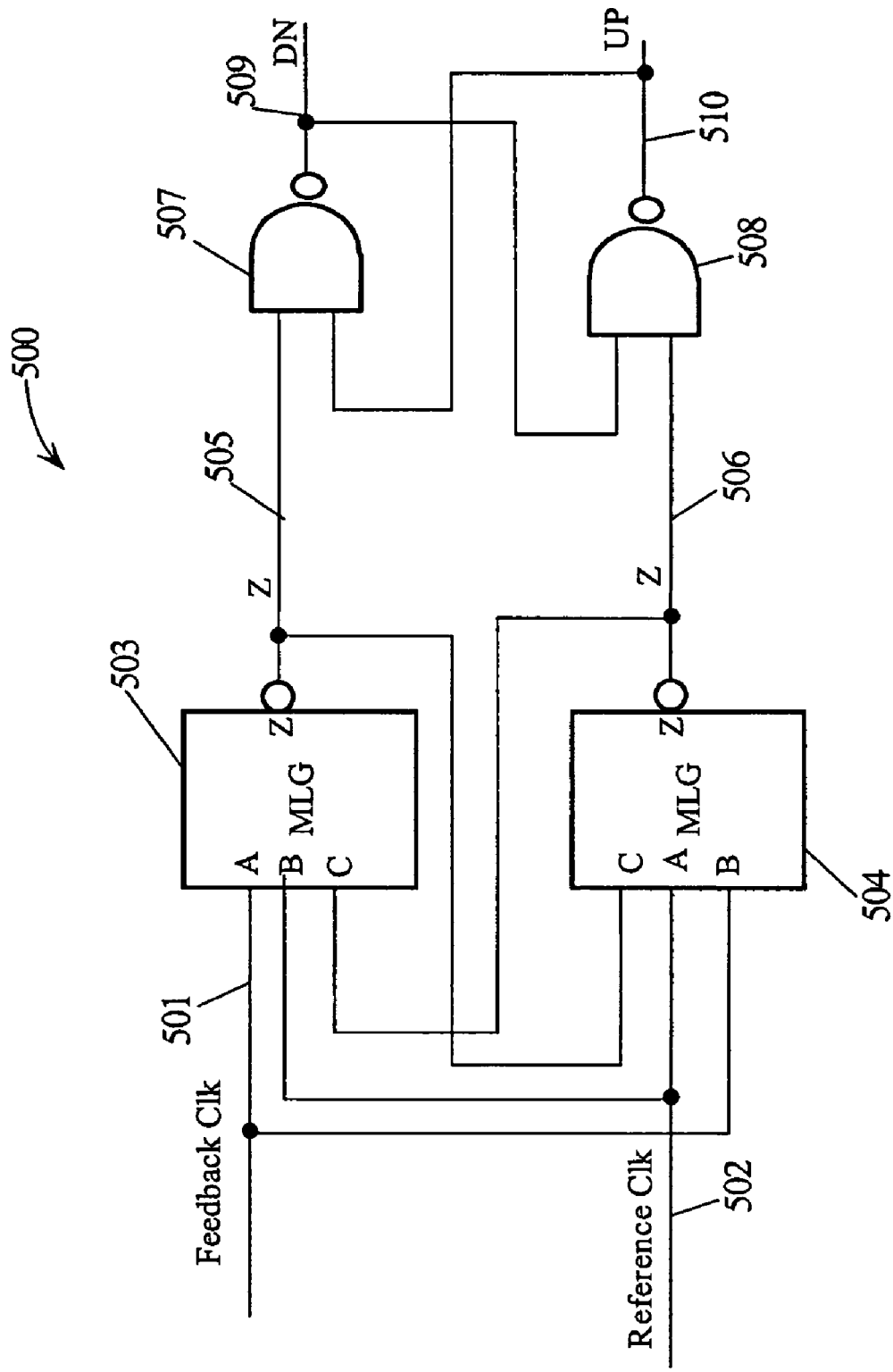
FIG. 5 is a circuit diagram of a phase detector according to embodiments of the present invention.

FIG. 5 is the circuit block diagram of a phase detector 500 according to embodiments of the present invention comprising an MLG 330 circuit topology described relative to FIG. 3. The operation of phase detector 500 will be explained with the assumption that feedback clock (FB) 501 is generated by delaying reference (REF) clock 501 through a voltage controlled delay line (e.g., DLL 100). To assure FB clock 501 can be phase aligned with REF clock 502, the delay line (not shown) has a dynamic range of delay from greater than one half a clock cycle of REF clock 502 to greater than one clock cycle of REF clock 502. Therefore, if FB clock 501 is lagging REF clock 502, then the delay in the path of FB clock 501 is reduced by asserting DN 509. Likewise, if FB clock 501 is leading REF clock 502, then the delay in the path of FB clock 501 is increased by asserting UP 510. This assumption only determines which inputs FB clock 501 and REF clock 502 drive to form a phase detector according to embodiments of the present invention. Switching the roles of DN 509 and UP 510 would only require the inputs be switched to form the corresponding correct control action.

Phase detector 500 has an MLG 503 (topology of MLG 300) in the logic path generating DN 509 and an MLG 504 (topology of MLG 300) in the logic path generating UP 510. NAND logic gates 507 and 508 form a set/reset (RS) latch wherein one of NAND 507 and 508 will have a logic one output state when both (Z 505 and Z 506) are a logic one. When Z 505 transitions to a logic zero DN 509 transitions to a logic one. If Z 505 transitions back to a logic one, then the state will be held, as UP 510 will be a logic zero which holds DN 509 as a logic one. Likewise, when Z 506 transitions to a logic zero UP 510 transitions to a logic one. If Z 506 transitions back to a logic one, then the state will be held as DN 509 will be a logic zero which holds UP 510 as a logic one.

Assume FB clock 501 lags REF clock 502 (too much delay in the path of feedback clock 501). Therefore, there is a period before REF clock 502 transitions to a logic one when (FB clock 501 and REF clock 502) are concurrently a logic zero. Since both MLG 503 and MLG 504 have the topology 300, refer to state table 320 to see the logic state of outputs Z 505 and Z 506 for this input condition. FB clock 501 is coupled to input A of MLG 503 and input B of MLG 504. Likewise, REF clock 502 is coupled to input B of MLG 503 and input A of MLG 504. This is important to the operation of phase detector 500.

If both FB clock 501 and REF clock 502 are a logic zero, then both outputs Z 505 and Z 506 are a logic one independent of the logic state of input C. See states 1 and 3 in state table 320 of FIG. 3B. Since REF clock 502 is leading FB clock 501, it will be the first to transition to a logic one. Referring to state table 320, it is seen that Z 505 transitions to a logic zero when REF clock 502 transitions to a logic one (state 7). Since output Z 505 is coupled to input C of MLG 504, input B and input C are a logic zero when REF clock 502 completes the transition to a logic one and the output Z 505 is asserted as a logic zero. This corresponds to state 4 for MLG 504, therefore, output Z 506 remains at a logic one after a brief floating condition (state 6) while input C to MLG 504 transitions to a logic zero in response to the transition of output Z 505 to a logic zero. When Z 505 transitions to a logic zero, the latch (formed by NAND gates 507 and 508) is set and DN 509 transitions to a logic one causing the delay in the logic path of FB clock 501 to be reduced thereby causing the next positive transition of REF clock 502 to lag FB clock 501 by a smaller amount. When FB clock 501 transitions to a logic one, there is a period when both FB clock 501 and REF clock 501 are concurrently at a logic one. Since Z 506 is a logic one, MLG 503 transitions from state 7 to state 8 and its output Z 505 remains at a logic zero. MLG 504 transitions from state 2 to state 5 and its output Z 506 remains at a logic one. When REF clock 502 transitions to a logic zero, MLG 504 transitions from state 5 to state 2 and output Z 506 remains at a logic one. On the same transition, MLG 503 transitions from state 8 to state 6 wherein output Z 505 floats. Since the latch is already set and the reset input (Z 506) remains a logic one, the state of output Z 505 is a don't care condition. When FB clock 501 again transitions to a logic zero, MLG 503 transitions to state 3 and output Z 505 transitions back to a logic one. This cycle will continue as long as FB clock 501 lags REF clock 502. Since output Z 506 never transitions to a logic zero in this scenario, the logic one at DN 509 keeps decreasing the delay in the path of FB clock 501. Eventually, the delay will be reduced to a point where FB clock 501 transitions from lagging REF clock 502 during one clock cycle to leading in the next clock cycle. This results in the second condition for phase detector 500 when FB clock 501 leads REF clock 502.

If both FB clock 501 and REF clock 502 are at a logic zero, then both outputs Z 505 and 506 are a logic one independent of the state on input C. See states 1 and 3 in state table 320 of FIG. 3B. Since FB clock 501 is leading REF clock 502, it will be the first to transition to a logic one. Referring to state table 320, it is seen that Z 506 transitions to a logic zero when FB clock 501 transitions to a logic one. MLG 504 transitions from state 3 to state 7. Since output Z 506 is coupled to input C of MLG 503, input B and input C are a logic zero when FB clock 501 completes the transition to a logic one and the output Z 506 is asserted as a logic zero. This corresponds to state 4 for MLG 503; therefore, output Z 505 remains at a logic one after a brief floating condition (state 6) while input C to MLG 503 transitions to a logic zero in response to the transition of output Z 506 to a logic zero. When Z 506 transitions to a logic zero, the latch (formed by NAND gates 507 and 508) is set and UP 510 transitions to a logic one causing the delay in the logic path of FB clock 501 to be increased thereby causing the next positive transition of FB clock 501 to lag REF clock 502 by a smaller amount. When REF clock 502 transitions to a logic one, there is a period when both FB clock 501 and REF clock 502 are concurrently at a logic one. Since Z 505 is a logic one, MLG 504 transitions from state 7 to state 8 and its output Z 506 remains at a logic zero. MLG 503 transitions from state 2 to state 5 and its output Z 505 remains at a logic one. When FB clock 501 transitions to a logic zero MLG 503 transitions from state 5 to state 2 and output Z 505 remains at a logic one. On the same transition, MLG 504 transitions from state 8 to state 6 wherein output Z 506 floats. Since the latch is already reset and the set input (Z 505) remains a logic one, the state of output Z 506 is a don't care condition.

When REF clock 502 again transitions to a logic zero, MLG 504 transitions to state 3 and output Z 506 transitions back to a logic one. This cycle will continue as long as REF clock 502 lags FB clock 501. Since output Z 505 never transitions to a logic zero in this scenario, the logic one at UP 510 keeps increasing the delay in the path of FB clock 501. Eventually, the delay will be increased to a point where REF clock 502 will again go from lagging FB clock 501 during one clock cycle to leading in the next clock cycle. In this manner, the "bang—bang" control of the delay in the logic path of FB clock 501 keeps FB clock 501 and REF clock 502 phase aligned (in the average). The response of the control loop will determine how much the delay can be changed in one clock cycle and thus how much phase error will exist between REF clock 502 and FB clock 501.

Figure 6:
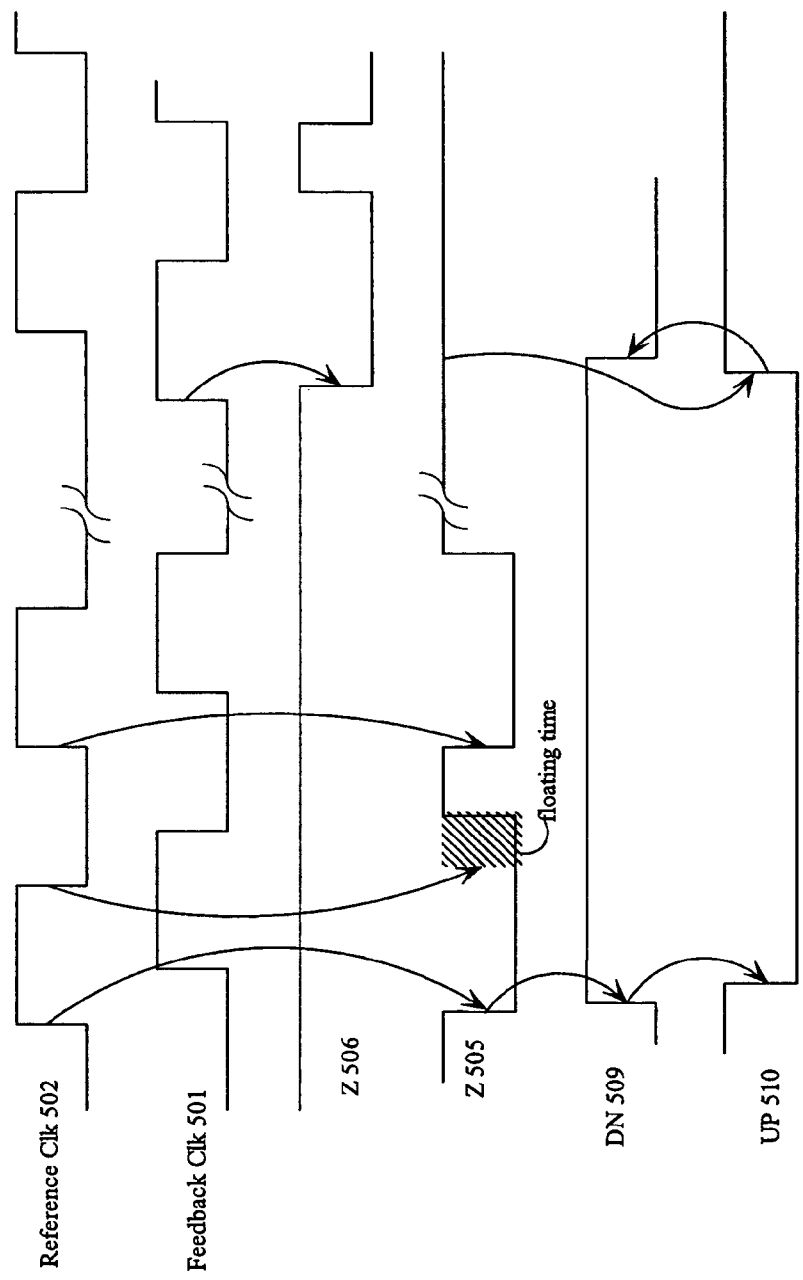
FIG. 6 is a timing diagram illustrating signal timings for the circuit of FIG. 5.

FIG. 6 is a timing diagram of signals in the phase detector of FIG. 5. The time in which output Z 505 is in a floating state is highlighted.

Figure 8:
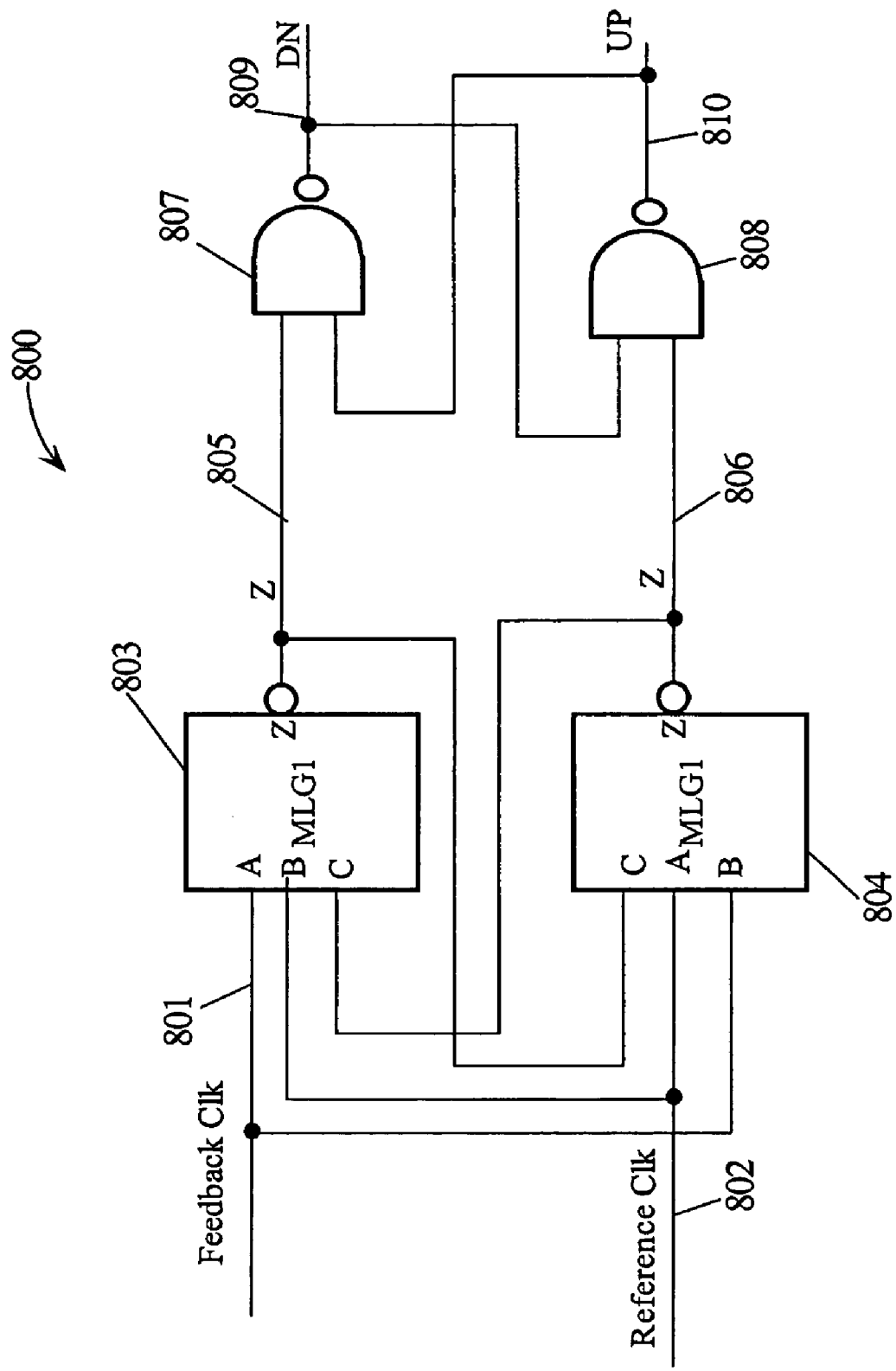
FIG. 8 is a circuit diagram of a phase detector according to another embodiment of the present invention.

FIG. 8 is a phase detector 800 using MLG1 400 topology for MLG1 803 and MLG1 804. Using the MLG1 400 topology eliminates the floating condition in state 6 when MLG 300 topology circuits are used in phase detector 500. Referring to FIG. 4, one can see that when input A and C are a logic one, output Z 411 is pulled-down with NFET 413 and NFET 407. However, adding NFET 413 causes another condition to occur. Referring to state table 420, one can see that when FB clock 801 and REF clock 802 are a logic zero, both Z 805 and Z 806 are a logic one. This corresponds to states 1 and 3 in state table 420. When REF clock 802 transitions to a logic one, MLG1 803 transitions to state 6 from state 3 and output Z 805 should transition to a logic zero. MLG1 804 should also transition from state 3 to state 6 with Z 806 transitioning from a logic one to a logic zero. However, this would prevent Z 805 from transitioning to logic zero. If this condition were not corrected, then phase detector 800 would not have the logic functionality of phase detector 500 required for the phase detector according to embodiments of the present invention. However, by making NFET 406 larger than 413, the conduction path of NFETs 406–407 in MLG1 803 assures that output Z 805 will pull before the conduction path of NFETs 413 and 407 in MLG1 804 can pull low output Z 806 low, thus eliminating the race condition. This assures that phase detector 800 with MLG1 400 topology circuits for MLG1 803 and MLG1 804 will have the logic functionality of phase detector 500 while eliminating the floating state.

Figure 9:
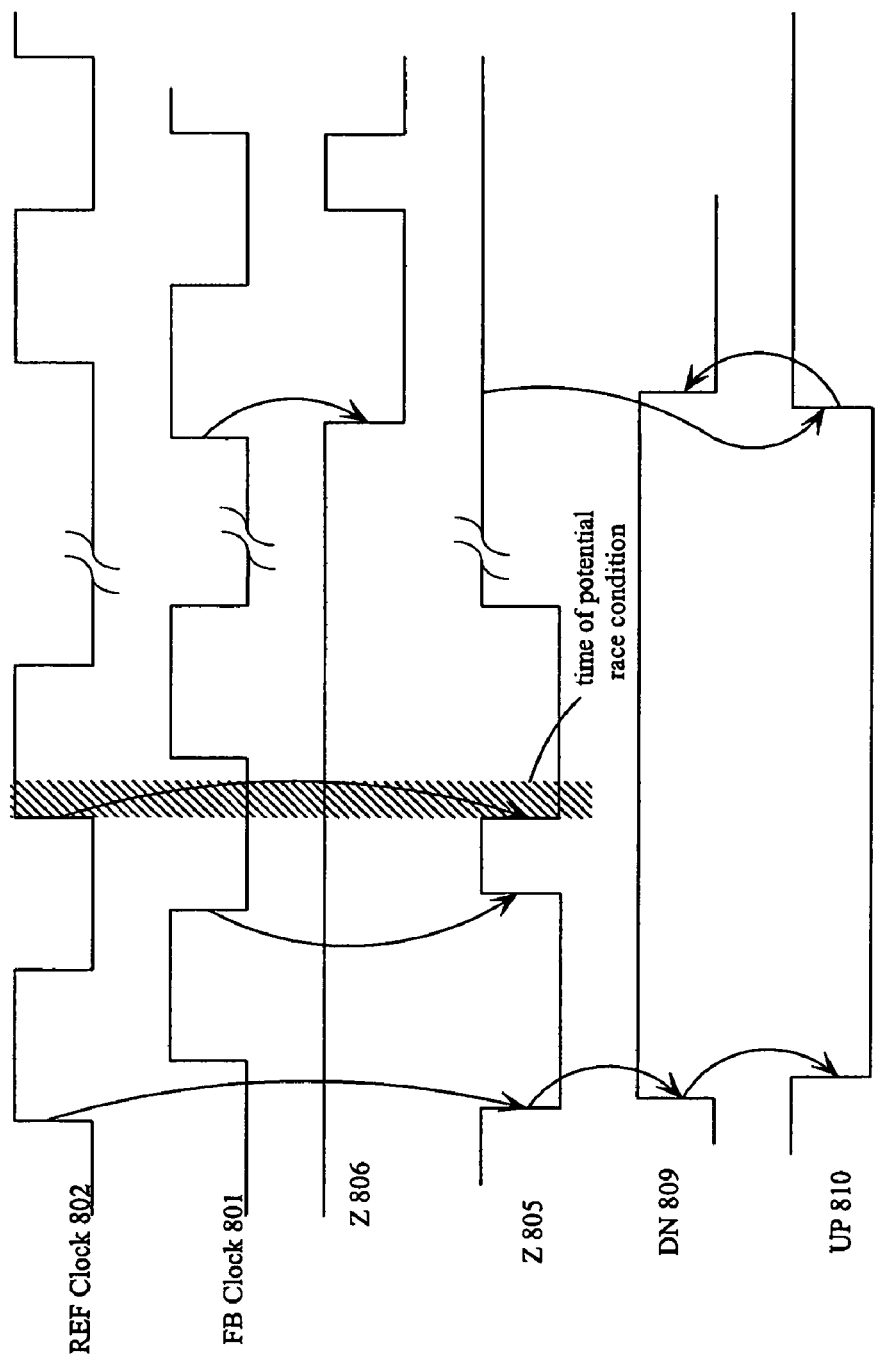
FIG. 9 is a timing diagram illustrating signal timings for the circuit of FIG. 8.

FIG. 9 is a timing diagram of signals in the phase detector of FIG. 8. A time in which outputs Z 805 and Z 806 are subject to the described race condition eliminated by sizing NFETs 413 and 406 is highlighted.

Figure 7:
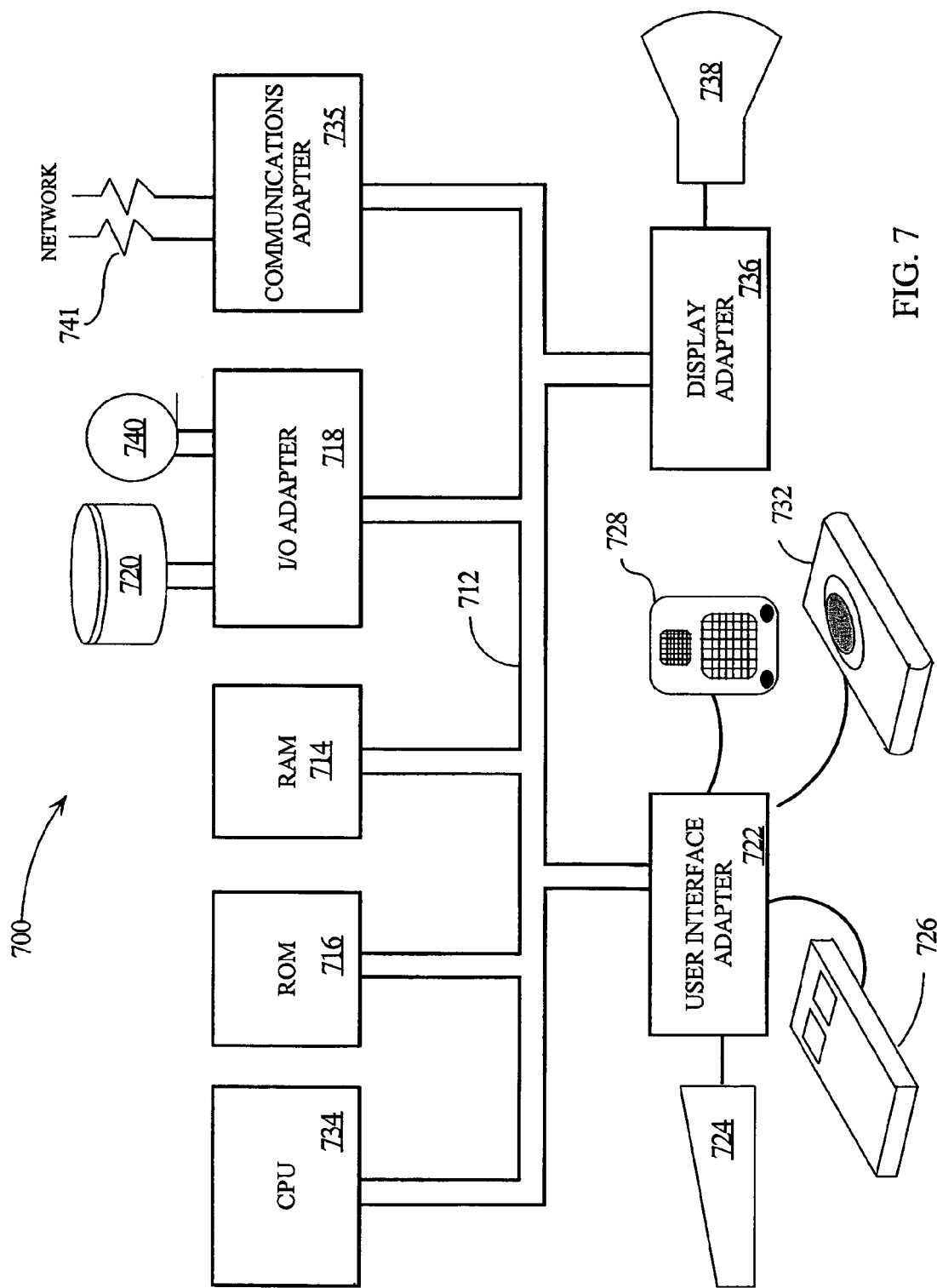
FIG. 7 is a block diagram of a data processing system suitable for practicing embodiments of the present invention.

FIG. 7 is a high level functional block diagram of a representative data processing system 700 suitable for practicing the principles of the present invention. Data processing system 700 includes a central processing system (CPU) 710 operating in conjunction with a system bus 712. System bus 712 operates in accordance with a standard bus protocol, such as the ISA protocol, compatible with CPU 734. CPU 734 operates in conjunction with electronically erasable programmable read-only memory (EEPROM) 716 and random access memory (RAM) 714. Among other things, EEPROM 716 supports storage of the Basic Input Output System (BIOS) data and recovery code. RAM 714 includes, DRAM (Dynamic Random Access Memory) system memory and SRAM (Static Random Access Memory) external cache. I/O Adapter 718 allows for an interconnection between the devices on system bus 712 and external peripherals, such as mass storage devices (e.g., a hard drive, floppy drive or CD/ROM drive), or a printer 740. A peripheral device 720 is, for example, coupled to a peripheral control interface (PCI) bus, and I/O adapter 718 therefore may be a PCI bus bridge. User interface adapter 722 couples various user input devices, such as a keyboard 724 or mouse 726 to the processing devices on bus 712. Display 738 which may be, for example, a cathode ray tube (CRT), liquid crystal display (LCD) or similar conventional display units. Display adapter 736 may include, among other things, a conventional display controller and frame buffer memory. Data processing system 700 may be selectively coupled to a computer or telecommunications network 741 through communications adapter 734. Communications adapter 734 may include, for example, a modem for connection to a telecom network and/or hardware and software for connecting to a computer network such as a local area network (LAN) or a wide area network (WAN). CPU 734 and other components of data processing system 700 may contain DLL circuitry for local generation of clocks wherein the DLL circuitry employs a phase detector according to embodiments of the present invention to conserve power and to reduce phase jitter.

Although the present invention and its advantages have been described in detail, it should be understood that various changes, substitutions and alterations can be made herein without departing from the spirit and scope of the invention as defined by the appended claims.

What is claimed is:

1. A phase detector generating first and second control signals in response to a phase difference between a first clock and a second clock comprising:
    a latch having a set input, a reset input, a first latch output generating the first control signal, and a second latch output generating the second control signal;
    a first modified logic gate (MLG) having first, second, and third logic inputs, and a first logic output generating a logic one in response to a first logic combination of logic zero states of the first, second and third logic inputs and generating a logic zero in response to a second logic combination of the logic one states of the first, second, and third logic inputs, wherein the first logic input of the first MLG is coupled to the second clock, the second logic input of the first MLG is coupled to the first clock, and the first logic output is coupled to the set input; and
    a second MLG having first, second, and third logic inputs and a second logic output generating a logic one in response to the first logic combination of logic zero states of the first, second and third logic inputs and generating a logic zero in response to the second logic combination of the logic one states of the first, second, and third logic inputs, wherein the first logic input of the second MLG is coupled to the first clock, the second logic input of the second MLG is coupled to the second clock, the third logic input of the second MLG is coupled to the first logic output, and the second logic output is coupled to the reset input and the third logic input of the first MLG.

2. The phase detector of claim 1, wherein the first logic combination generates the first logic state when the first and second logic inputs are a logic zero or the third logic input is logic zero.

3. The phase detector of claim 2, wherein the second logic combination generates the second logic state when the second and third logic inputs are at a logic one and the logic state of the first input is either a logic one or a logic zero.

4. The phase detector of claim 3, wherein a floating state is generated when the first and third logic inputs are a logic one and the second logic input is a logic zero.

5. The phase detector of claim 2, wherein the second logic combination generates the logic zero state when the first and third logic inputs are a logic one or the second and third logic inputs are a logic one and the logic zero state is preferentially asserted by the logic AND of the logic one states of the second and third inputs over the logic AND of the logic one states of the first and third inputs.

6. The phase detector of claim 1, wherein the latch comprises:
    a first NAND logic gate having a first input coupled to the reset input, a second input and an output coupled to the first latch output; and
    a second NAND logic gate having a first input coupled to the set input, a second input coupled to the first latch output, and a second output coupled to the second latch output and the second input of the first NAND logic gate.

7. The phase detector of claim 1, wherein the first MLB comprises:
    a first P channel field effect transistor (PFET) having a source coupled to a positive power supply potential, a gate coupled to the first logic input, and a drain;
    a second PFET having a source coupled to the drain of the first PFET, a gate coupled to the second logic input, and a source coupled to the first logic output;
    a third PFET having a source coupled to the positive power supply potential, a gate coupled to the third logic input, and a drain coupled to the first logic output;
    a first N channel field effect transistor (NFET) having a drain coupled to the first logic output, a gate coupled to the second logic input, and a source; and
    a second NFET having a drain coupled to the source of the first NFET, a source coupled to a ground potential of the power supply, and a gate coupled to the third logic input.

8. The phase detector of claim 7, wherein the second MLB is the logic equivalent of the first MLB.

9. The phase detector of claim 5, wherein the first MLB comprises:
    a PFET having a source coupled to a positive power supply potential, a gate coupled to the first logic input, and a drain;
    a second PFET having a source coupled to the drain of the first PFET, a gate coupled to the second logic input, and a source coupled to the first logic output;
    a third PFET having a source coupled to the positive power supply potential, a gate coupled to the third logic input, and a drain coupled to the first logic output;
    a first NFET having a drain coupled to the first logic output, a gate coupled to the second logic input, and a source;
    a second NFET having a drain coupled to the source of the first NFET, a source coupled to a ground potential of the power supply, and a gate coupled to the third logic input; and
    a third NFET having a drain coupled to the first logic output, a source coupled to the source of the second NFET, and a gate coupled to the first logic input.

10. The phase detector of claim 9, wherein the second MLB is a logic equivalent of the first MLB.

11. The phase detector of claim 8, wherein the second NFET is materially larger than the third NFET with corresponding higher conductivity.

12. A delay locked loop for phase aligning a first clock and a second clock comprising:
    a voltage variable delay circuit having a delay variable in the range from one half a clock cycle of the first clock and greater than one clock cycle of the first clock in response to a control voltage;
    a voltage generator that generates the control voltage as an increasing voltage in response to a first logic state of a first control signal and a decreasing voltage in response to the first logic state of a second control signal; and a phase detector generating the first and second control signals in response to a phase difference between the first clock and the second clock, the phase detector having a latch with a set input, a reset input, a first latch output generating the first control signal, and a second latch output generating the second control signal, a first modified logic gate (MLG) having first, second, and third logic inputs, and a first logic output generating a logic one in response to a first logic combination of logic zero states of the first, second and third logic inputs and generating a logic zero in response to a second logic combination of the logic one states of the first, second, and third logic inputs, wherein the first logic input of the first MLG is coupled to the second clock, the second logic input of the first MLG is coupled to the first clock, and the first logic output is coupled to the set input, and a second MLG having first, second, and third logic inputs and a second logic output generating a logic one in response to the first logic combination of logic zero states of the first, second and third logic inputs and generating a logic zero in response to the second logic combination of the logic one states of the first, second, and third logic inputs, wherein the first logic input of the second MLG is coupled to the first clock, the second logic input of the second MLG is coupled to the second clock, the third logic input of the second MLG is coupled to the first logic output, and the second logic output is coupled to the reset input and the third logic input of the first MLG.

13. The delay locked loop of claim 12, wherein the first logic combination generates the first logic state when the first and second logic inputs are a logic zero or the third logic input is a logic zero.

14. The delay locked loop of claim 13, wherein the second logic combination generates the second logic state when the second and third logic inputs are at a logic one and the logic state of the first input is either a logic one or a logic zero.

15. The delay locked loop of claim 14, wherein a floating state is generated when the first and third logic inputs are a logic one and the second logic input is a logic zero.

16. The delay locked loop of claim 13, wherein the second logic combination generates the logic zero state when the first and third logic inputs are a logic one or the second and third logic inputs are a logic one and the logic zero state is preferentially asserted by the logic AND of the logic one states of the second and third inputs over the logic AND of the logic one states of the first and third inputs.

17. The delay locked loop of claim 12, wherein the latch comprises:
a first NAND logic gate having a first input coupled to the reset input, a second input and an output coupled to first latch output; and
a second NAND logic gate having a first input coupled to the set input, a second input coupled to the first latch output, and a second output coupled to the second latch output and the second input of the first NAND logic gate.

18. The delay locked loop of claim 12, wherein the first MLB comprises:
a first P channel field effect transistor (PFET) having a source coupled to a positive power supply potential, a gate coupled to the first logic input, and a drain;
a second PFET having a source coupled to the drain of the first PFET, a gate coupled to the second logic input, and a source coupled to the first logic output;

a third PFET having a source coupled to the positive power supply potential, a gate coupled to the third logic input, and a drain coupled to the first logic output;
a first NFET having a drain coupled to the first logic output, a gate coupled to the second logic input, and a source; and
a second NFET having a drain coupled to the source of the first NFET, a source coupled to a ground potential of the power supply, and a gate coupled to the third logic input.

19. The delay locked loop of claim 18, wherein the second MLB is the logic equivalent of the first MLB.

20. The delay locked loop of claim 16, wherein the first MLB comprises:
a first PFET having a source coupled to a positive power supply potential, a gate coupled to the first logic input, and a drain;
a second PFET having a source coupled to the drain of the first PFET, a gate coupled to the second logic input, and a source coupled to the first logic output;
a third PFET having a source coupled to the positive power supply potential, a gate coupled to the third logic input, and a drain coupled to the first logic output;
a first NFET having a drain coupled to the first logic output, a gate coupled to the second logic input, and a source;
a second NFET having a drain coupled to the source of the first NFET, a source coupled to a ground potential of the power supply, and a gate coupled to third logic input; and
a third NFET having a drain coupled to the first logic output, a source coupled to the source of the second NFET, and a gate coupled to the first logic input.

21. The delay locked loop of claim 20, wherein the second MLB is a logic equivalent of the first MLB.

22. The delay locked loop of claim 19, wherein the second NFET is materially larger that the third NFET with corresponding higher conductivity.

23. A data processing system comprising:
a central processing unit (CPU) as one or more integrated circuits having a second clock locally generated from a distributed first clock using a delay locked loop for phase aligning the first clock and the second clock, the delay locked loop having a voltage variable delay circuit having a delay, variable in the range, from one half a clock cycle of the first clock to greater than one clock cycle of the first clock in response to a control voltage, a voltage generator that generates the control voltage as an increasing voltage in response to a first logic state of a first control signal and a decreasing voltage in response to the first logic state of a second control signal, and a phase detector generating the first and second control signals in response to a phase difference between the first clock and the second clock, the phase detector having a latch with a set input, a reset input, a first latch output generating the first control signal, and a second latch output generating the second control signal, a first modified logic gate (MLG) having first, second, and third logic inputs, and a first logic output generating a logic one in response to a first logic combination of logic zero states of the first, second and third logic inputs and generating a logic zero in response to a second logic combination of the logic one states of the first, second, and third logic inputs, wherein the first logic input of the first MLG is coupled to the second clock, the second logic input of the first MLG is coupled to the first clock, and the first logic output is coupled to the set input, and a second MLG having first, second, and third logic inputs and a second logic output generating a logic one in response to the first logic combination of logic zero states of the first, second and third logic inputs and generating a logic zero in response to the second logic combination of the logic one states of the first, second, and third logic inputs, wherein the first logic input of the second MLG is coupled to the first clock, the second logic input of the second MLG is coupled to the second clock, the third logic input of the second MLG is coupled to the first logic output, and the second logic output is coupled to the reset input and the third logic input of the first MLG.

24. The phase detector of claim 12, wherein the first logic combination generates the first logic state when the first and second logic inputs are a logic zero or the third logic input is a logic zero.

25. The data processing system of claim 24, wherein the second logic combination generates the second logic state when the second and third logic inputs are at a logic one and the logic state of the first input is either a logic one or a logic zero.

26. The data processing system of claim 25, wherein a floating state is generated when the first and third logic inputs are a logic one and the second logic input is a logic zero.

27. The data processing system of claim 24, wherein the second logic combination generates the logic zero state when the first and third logic inputs are a logic one or the second and third logic inputs are a logic one and the logic zero state is preferentially asserted by the logic AND of the logic one states of the second and third inputs over the logic AND of the logic one states of the first and third inputs.

28. The data processing system of claim 23, wherein the latch comprises:
  a first NAND logic gate having a first input coupled to the reset input, a second input and an output coupled to first latch output; and
  a second NAND logic gate having a first input coupled to the set input, a second input coupled to the first latch output, and a second output coupled to the second latch output and the second input of the first NAND logic gate.

29. The data processing system of claim 23, wherein the first MLB comprises:
  a first P channel field effect transistor (PFET) having a source coupled to a positive power supply potential, a gate coupled to the first logic input, and a drain;
  a second PFET having a source coupled to the drain of the first PFET, a gate coupled to the second logic input, and a source coupled to the first logic output;
  a third PFET having a source coupled to the positive power supply potential, a gate coupled to the third logic input, and a drain coupled to the first logic output;
  a first NFET having a drain coupled to the first logic output, a gate coupled to the second logic input, and a source; and
  a second NFET having a drain coupled to the source of the first NFET, a source coupled to a ground potential of the power supply, and a gate coupled to the third logic input.

30. The data processing system of claim 29, wherein the second MLB is the logic equivalent of the first MLB.

31. The data processing system of claim 27, wherein the first MLB comprises:
  a first PFET having a source coupled to a positive power supply potential, a gate coupled to the first logic input, and a drain;
  a second PFET having a source coupled to the drain of the first PFET, a gate coupled to the second logic input, and a source coupled to the first logic output;
  a third PFET having a source coupled to the positive power supply potential, a gate coupled to the third logic input, and a drain coupled to the first logic output;
  a first NFET having a drain coupled to the first logic output, a gate coupled to the second logic input, and a source;
  a second NFET having a drain coupled to the source of the first NFET, a source coupled to a ground potential of the power supply, and a gate coupled to the third logic input; and
  a third NFET having a drain coupled to the first logic output, a source coupled to the source of the second NFET, and a gate coupled to the first logic input.

32. The data processing system of claim 31, wherein the second MLB is a logic equivalent of the first MLB.

33. The data processing system of claim 30, wherein the second NFET is materially larger that the third NFET with corresponding higher conductivity.

* * * * *